US006885016B2

United States Patent
Worley et al.

(10) Patent No.: US 6,885,016 B2
(45) Date of Patent: Apr. 26, 2005

(54) SWITCHING POWER SUPPLY CIRCUIT USING A SILICON BASED LED FOR FEEDBACK

(76) Inventors: Eugene Robert Worley, 11 Bowditch, Irvine, CA (US) 92620; Charles Ye Ying Jie Chu, 38 Woodleaf, Irvine, CA (US) 92614

( * ) Notice: Subject to any disclaimer, the term of this patent is extended or adjusted under 35 U.S.C. 154(b) by 13 days.

(21) Appl. No.: 10/233,982

(22) Filed: Sep. 3, 2002

(65) Prior Publication Data

US 2003/0042437 A1 Mar. 6, 2003

Related U.S. Application Data

(60) Provisional application No. 60/316,861, filed on Sep. 4, 2001.

(51) Int. Cl.[7] .............................................. G02B 27/00
(52) U.S. Cl. .................. 250/551; 250/239; 250/227.24
(58) Field of Search ................................ 250/551, 239, 250/227.24; 438/25, 26; 257/80–84; 323/282, 284, 287

(56) References Cited

U.S. PATENT DOCUMENTS 5,148,243 A * 9/1992 Merrick et al. ............... 257/81
5,545,893 A * 8/1996 Brown et al. ................ 250/239

OTHER PUBLICATIONS

Ravindra Ambatipudi, "Design of Isolated Converters Using Simple Switchers", National Semiconductor, Application Note 1095, Aug. 1998.*

* cited by examiner

Primary Examiner—Thanh X. Luu
Assistant Examiner—Seung C. Sohn

(57) ABSTRACT

Flyback power supplies require three chip integrated circuits to control the switching cycles on the primary of a transformer including a chip that detects when a voltage threshold and optionally when a current threshold has been crossed on the secondary side of the transformer, an opto-coupler to isolate the secondary to primary feedback from the first chip, and a switch control circuit that receives the feedback information from the opto-coupler and uses the information to modulate the primary pulses in order to regulate the secondary voltage and to optionally set a current compliance limit on the secondary current. This invention shows how these three integrated circuits can be combined into one package using silicon based LEDs. Furthermore, circuit techniques are presented that allow the detection of low level light produced by silicon based LEDs. These techniques include disconnecting the power supply from sensing circuits and using a charge capacitor for power and performing the sensing operation during a period of time when clocked digital circuits are inactive.

5 Claims, 8 Drawing Sheets

SWITCHING POWER SUPPLY CIRCUIT USING A SILICON BASED LED FOR FEEDBACK

This application claims benefit of 60/316,861 filed Sep. 4, 2001.

FIELD OF THE INVENTION

This invention relates to AC to DC flyback switching power supplies in which isolated feedback is provided from the reference circuit of the secondary of a power supply transformer to the primary side switching circuit using an opto-coupler. More specifically, an integrated circuit is realized which combines the secondary reference threshold function, the opto coupler function, and the primary power switching control function into a single package using a silicon based LED.

PRIOR ART

There are many electrical appliances which require a low DC voltage for operation such as radios, telephones, tape players, CD players, battery chargers for cell phones, note book PCs, etc. In many cases, it is desirable to derive power for these devices from the AC house current which, for the United States, is approximately 115 VAC. Power supplies are thus used to convert AC house voltage to a DC voltage suitable to power a given electrical appliance.

Many low cost power supplies use a 60 Hz transformer to lower the AC voltage from about 115 VAC for US house current to a lower voltage, typically in the range of 3 to 24 VAC. Either a diode bridge rectifier or a single diode half wave rectifier is then used to convert the AC voltage to a pulsating DC voltage. A filter such as a capacitor or an inductor or both is then used to remove the DC ripple. Regulation is typically provided by a series regulator integrated circuit. Unfortunately, there are limitations in using this approach. Low frequency, 60 Hz transformers are bulky, expensive, and lossy. Furthermore, series regulation is also lossy thereby further lowering power efficiency.

For high efficiency, light weight power supplies which operate off of VAC house current and provide a low voltage DC output switching power supplies are used. Switching rates range from a few 10's of Kilo-Hertz to over 100 kHz. The high switching rates reduce the size of transformer over that of a 60 Hz transformer and, hence, the cost as well. Also, the power conversion efficiency is improved over that of a 60 Hz transformer. Regulation is done by varying the switching rate which is more efficient than series regulation. Also, filtering is done with smaller, less expensive components given the higher frequency. Finally, the power supply can be designed to operate over a wide range of input AC voltages and frequencies such as voltages from 85 VAC to 270 VAC and frequencies from 50 to 60 Hz or even DC. Thus, the many different power standards that can be encountered throughout the world can be accommodated without having to add switches or transformer winding taps or any other additional components.

FIG. 1 shows an example of a prior art switching power supply system (See FIG. 11, page 7 of the TNY 253/254/255, February 1999 data sheet of Power Integrations, Inc. or FIG. 3 of On Semiconductor's application note AND8024/D or FIG. 6, page 5 of National Semiconductor's application note 1095). The DC input voltage, Vin 112, typically comes from rectifying house AC voltage with a diode bridge rectifier and then filtering the output from the rectifier using a capacitor and possibly an inductor. The transformer, T1 100, is used to both isolate the output from the house AC line and to down convert the input voltage. Feed back isolation is provided by the opto-coupler 103.

The opto coupler 103 typically uses an efficient GaAs LED 118 which typically has a quantum efficiency in the range of $10^{-3}$ to $10^{-2}$. This quantum efficiency is high enough such that a passive bipolar transistor 119 can be used as a photo activated switch.

The Switch Control circuit 101 turns a MOS power transistor, 105, "on" and "off" according to an internal oscillator and the state of the an coupler light detector switch 119. When power transistor 105 is turned "on" a DC voltage is applied across the primary 120 of T1 100. A current will then build up over time based on the inductance of the primary coil 120. Since the applied voltage is constant, the current increases linearly over time and thus has a ramp shape. When the primary 120 current reaches a certain threshold value determined by the Switch Control 101 the MOS power transistor 105 will be turned "off" by the Switch Control 101. The Switch Control 101 measures the current in the primary 120 by measuring the voltage drop across resistor 106. The voltage drop across resistor 106 at the current threshold is made as small as possible to maximize efficiency. The inductance of the primary 120 is made such that the time required to reach the threshold current is less than the frequency of the oscillator of the Switch Control 101. Components C1 107, R2 108, and D2 121 are used to suppress the turn off voltage spike associated with the so called leakage inductance. The leakage inductance is an inductance that is not coupled to the secondary. Without 107, 108, and 121, turn off voltage spikes can reach high values on the drain of M1 105 and possibly cause damage to M1 105. The collapse of the current in the primary as M1 105 turns off results in a commutation current in the secondary which forward biases diode 109 and charges C3 111 as well as providing current to the load connected to the Vout 113 terminals. Thus, during the commutation phase as the primary 120 current is shut off by M1 105 a current pulse appears on the secondary 122 as the magnetic field collapses in T1 100.

Power to the Switch Control 101 is provided using a connection 123 to the low side 122 of the primary 120 of the transformer 100. When M1 105 is "off" the voltage on the low side 122 of the primary is high enough to power the Switch Control circuits which generally require a small amount of power. A ripple filter capacitor, 104, is used to smooth out the internal DC power supply voltage of Switch Control 101. The aforementioned approach is for powering the TNY253/254/255. The On Semiconductor application note uses a separate transformer winding to power the Switch Control circuit 101. FIG. 6 of the National Semiconductor application note 1095 shows the power to the Switch Control circuit or U1 coming from the high side 124 of the primary of the transformer.

The secondary 122 voltage is rectified by D1 109 and filtered by C3 111. The resulting DC output voltage, Vout 113, is sampled by a Voltage/Current Threshold Detect circuit 102 which is used to detect when the voltage 113 goes above a regulated target value, say 5.0V for illustration, or when the current exceeds a limit. The voltage drop across the secondary current sampling resistor, R3 110, is designed to be negligible.

For FIG. 3 of the aforementioned On Semiconductor application note AND8024/D, the Voltage/Current Threshold Detect circuit 102 of FIG. 1 corresponds to part number MC33341. For the TNY253/254/255 the Voltage/Current Threshold Detect circuit corresponds to a number of discrete components including R3, R4, R5, R6, R7, R8, R9, Q1, and VR1 of FIG. 11 of the TNY253/254/255, February 1999 data sheet. The power for 102 is applied via leads 117 and 116, which is the secondary ground of T1 100. Also, in this example, the voltage at the output 113 is compared to an internal voltage reference. For FIG. 3 of the On Semiconductor application note AND8024/D, the output voltage 113 is divided or ratioed by two discrete resistors and then compared to an internal voltage reference. When the Vout 113 voltage goes above the regulated value, 5.0V in this example, the LED 118 in the isolation feedback opto-coupler, Opto1 103, will be powered "on". The light from the Opto1's LED 118 will be detected by a photodetector switch 119 and signal the Switch Control 101 to skip pulses until Vout goes below 5V. Similarly, if the current flowing out to Vout 113 exceeds a predetermined value set by the Voltage/Current Threshold Detect circuit 102, the Voltage/Current Threshold Detect circuit 102 will turn "on" the LED 118. Current is determined by the Voltage/Current Threshold circuit 102 measuring the voltage drop across the current sensing resistor R3 110. Once again, with LED 118 "on" pulses will be skipped which will lower the current flowing out through Vout 113. Thus, Voltage/Current Threshold Detect circuit 102 in combination with the other elements produces a so called box function I-V characteristic. That is, the voltage is constant until a current limit is reached after which the current is constant.

Other features can also incorporated into the Switch Control 101 such as thermal shut down in which the pulses applied to the primary 120 are suspended if the temperature of M1 exceeds a certain value. In the TNY253/254/255 parts, M1 105 is integrated with the Switch Control 101 thereby allowing good thermal communication between M1 105 and the thermal shut down sensing circuitry of the Switch Control 101. For cases in which M1 105 is external to the Switch Control 101, M1 105 can be mounted on top of the Switch Control 101 package with a thermally conductive coupling agent such as silicon grease thereby allowing the thermal shut down sensing circuitry of 101 to sense the temperature of M1 105.

Another feature that can be incorporated into the Switch Control 101 is a duty cycle limit circuit. This circuit limits the "on" time of M1 105 to a value less than the period of oscillation so that T1 operates properly. Yet another feature is to shut down the pulses to the primary 120 if the DC voltage 112 is too low for proper operation.

It should be noted that for FIG. 1, the Switch Control 101 corresponds to MC33364, opto coupler 102 corresponds to 4N35, and the Voltage/Current Threshold Detect circuit 102 corresponds to the MC33341 of FIG. 3 of the On Semiconductor application note AND8024. Furthermore, the Switch Control 101 corresponds to LM2587 minus the primary power switch, opto coupler 102 corresponds to CNY17, and the Voltage/Current Threshold Detect circuit 102 corresponds to the LM3411 of FIG. 14 of the National Semiconductor application note 1095. As noted earlier, for the National Semiconductor configuration, the power is derived from the high side 124 of the primary.

In summary, ramped current pulses are applied to the primary 120 of T1 100 via a MOSFET switch M1 105. Regulation of the secondary output voltage is achieved by skipping pulses to the primary whenever the secondary voltage exceeds its desired value. Also, if the secondary current exceeds a predetermined limit value, the pulses applied to the primary are also skipped. To isolate the feed back from the secondary regulating circuitry to the primary control circuitry an opto-coupler is used.

SUMMARY OF THE INVENTION

According to the present invention, there is provided a means by which the primary side pulse control circuitry, the secondary Voltage/Current Threshold Detect circuitry, and the opto-coupler isolation means of a switching AC or DC to DC power supply are all placed into a single package. Two silicon die are used; one with the secondary Voltage/Current Threshold Detect circuitry and a silicon based LED and a second with a light detector and Switch Control circuitry. The prior art approach uses three packages instead of one as outlined in the Prior Art section. Reducing the number of packages from three to one reduces packaging cost and reduces printed circuit board cost by reducing board space.

Also, the present invention describes a light detector sensing technique which can detect the low levels of light produced by a silicon based LED. These techniques include integrating the light detector's signal during a noisy interval and sensing the integrated signal during a quiet period. The noisy interval is defined as a period in which digital switching takes place and a quiet period is defined as a quiescent period between switching intervals. Also, it is shown that system power supply noise can be eliminated by disconnecting the sensing circuit from the main power bus and taking power from a local capacitor during the sensing interval.

DESCRIPTION OF THE PREFERRED EMBODIMENT

It is possible to integrate low efficiency LEDs onto silicon. These LEDs may be fabricated by any number of means such as porous silicon, avalanching silicon PN junction, forward biased silicon PN junction, deposited silicon carbide junction, light emitting polymer, or deposited GaAs. In a recent article in Nature ("An efficient room-temperature silicon-based light-emitting diode", Vol. 410, pp. 192–194, Mar. 8, 2001) a silicon PN junction diode is disclosed with implant induced dislocation loops which efficiently produces light centered at about 1.15 nm. The quantum efficiency is quoted at $10^{-4}$ when edge emission is taken into account. This silicon based diode, in combination with a Schottky based silicon diode, can be used to make an all silicon opto coupler, and, more specifically, the flyback power supply integrated circuit described herein.

Another simple method of realizing a silicon based LED which is consistent with standard silicon processing is the avalanche LED. Light is produced when a PN junction is operated in the breakdown or avalanche mode. In this mode a diode is often referred to as a Zener diode. The low intensity light produced is in the visible part of the spectrum centered about the color yellow. In a paper ("An Efficient Low Voltage, High Frequency Silicon CMOS Light Emitting Device and Electro-Optical Interface", IEEE Electron Device Letters, Vol. 20, No. 12, December 1999) a 4V avalanche diode produced a quantum efficiency of 2e–6. This means that, for a light detector with a quantum efficiency of 1, 1 mA of input current produces 2 nA of detector current. Although small, enough detector current can be generated from this process to make an opto coupler. Going to higher breakdown voltages produces higher quantum efficiencies. In another paper (ref) a quantum efficiency of 2e–5 was achieved. However, going to higher voltages may necessitate the use of a capacitor based charge pump or voltage doubler. For example, a silicon avalanche LED with a breakdown voltage of 6V and a circuit operating at 5V would require a charge pump to boost the voltage to high enough value to power the LED.

Figure 1:
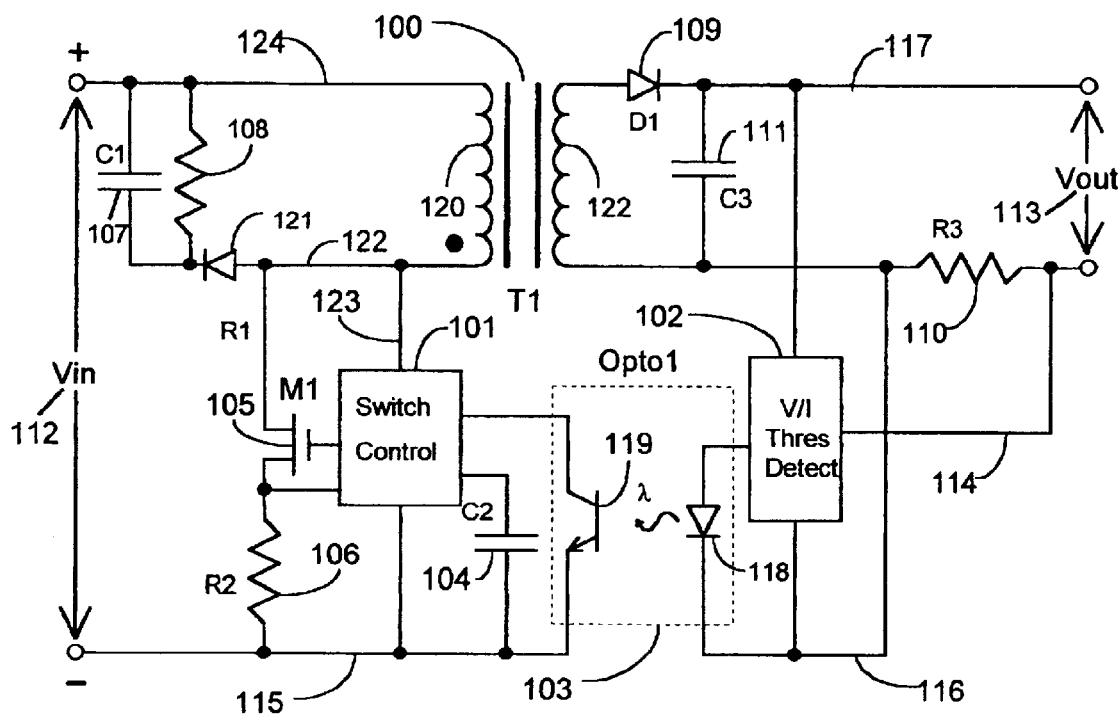
FIG. 1 shows a prior art AC or DC to DC flyback switching regulator.
Figure 2:
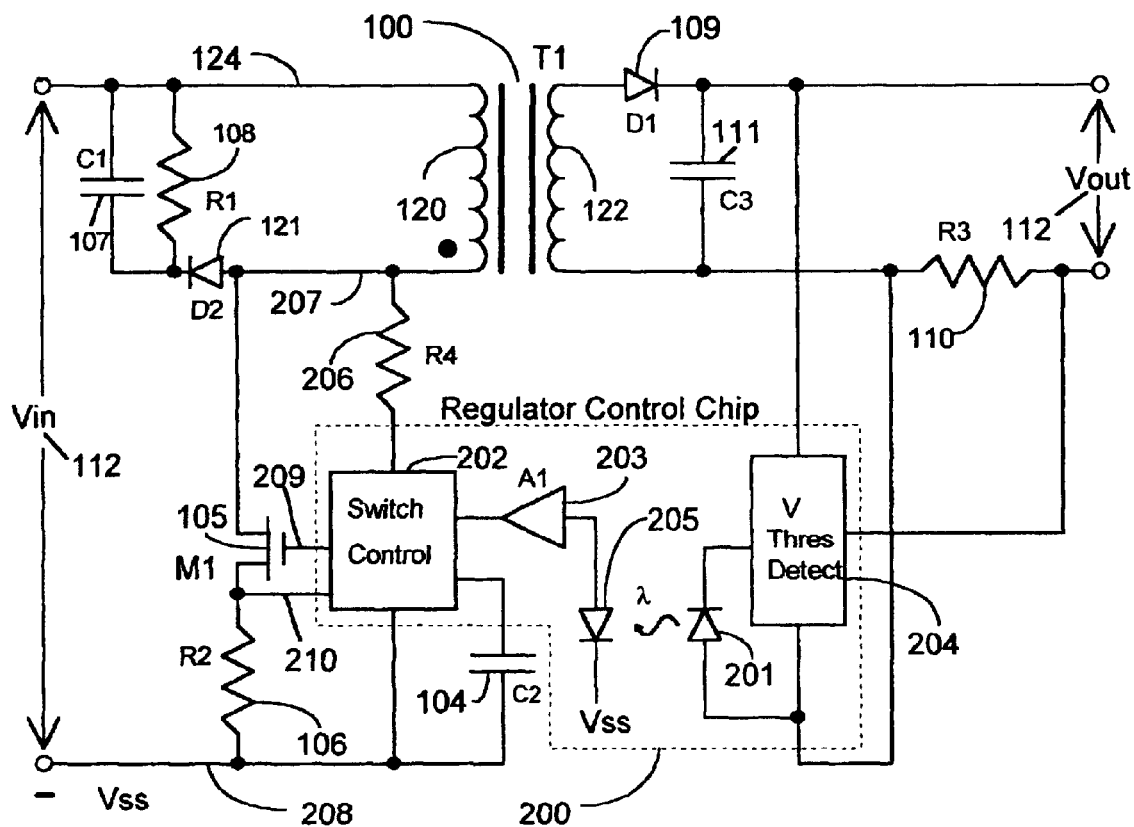
FIG. 2 shows the preferred embodiment of the flyback switching circuit in which three parts have been combined into one part.

FIG. 2 shows the preferred embodiment of a flyback power supply using a silicon based LED. The Switch Control circuit 202 of the preferred embodiment corresponds to the Switch Control circuit 101 of the prior art of FIG. 1. Also, the Voltage/Current Threshold Detect circuit 204 corresponds to the Voltage/Current Threshold Detect circuit 102. The prior art opto coupler 103 corresponds to the silicon based light emitter 201, the light detector 205, and the detector amplifier 203. In this embodiment the Voltage/Current Threshold circuit 204, the opto coupler elements 201, 203, and 205, and the Switch Control 202 are integrated into one package 200. Elements 202, 203, and 205 are integrated onto one silicon chip while elements 201 and 204 are integrated onto a second silicon chip. Also shown is a resistor 206 that is the used to limit the voltage used to power the Switch Control 202 and the light detector amplifier 203. It is noted that resistor 206 can be placed on chip as a poly silicon resistor if the field oxide breakdown voltage is high enough to sustain the high voltages that can appear from the low side 207 of the primary 120 to ground 208 of FIG. 2. The Switch Control 202 outputs a signal 209 that is used to drive the gate of the power MOSFET 105 thereby turning the power MOSFET alternately "on" and "off" when appropriate. Current in the power MOSFET 105 is sensed by the voltage drop across resistor 106 which is input to the Switch Control 202 via lead 210 and Vss 208.

In the preferred embodiment an avalanche junction LED 201 is schematically shown along with a junction diode light detector 205. As can be appreciated by one normally skilled in the art, the silicon based LED 201 can be fabricated by other means such as, but not limited to, forward biased silicon PN junction, deposited silicon carbide junction, a deposited light emitting polymer, or a deposited GaAs layer. Also, the light detector can be fabricated by other means such as, but limited to, a Schottky barrier diode, a photo conductor, a photo bipolar transistor, and an avalanche photo diode. The silicon avalanche LED, the deposited silicon carbide junction LED, the light emitting polymer LED, and the deposited GaAs all emit light that can be readily detected by all the silicon detectors previously listed. However, the forward biased silicon PN junction LED emits infrared that is not well absorbed by silicon. In this case a Schottky barrier diode would be used since can detect infrared light produced by a forward biased silicon junction diode. Of the aforementioned LED possibilities, an avalanche PN junction diode is the most likely LED candidate since is can be easily fabricated in a standard silicon semiconductor processing facility and it emits visible light that readily detected in a silicon PN junction diode.

Figure 3A:
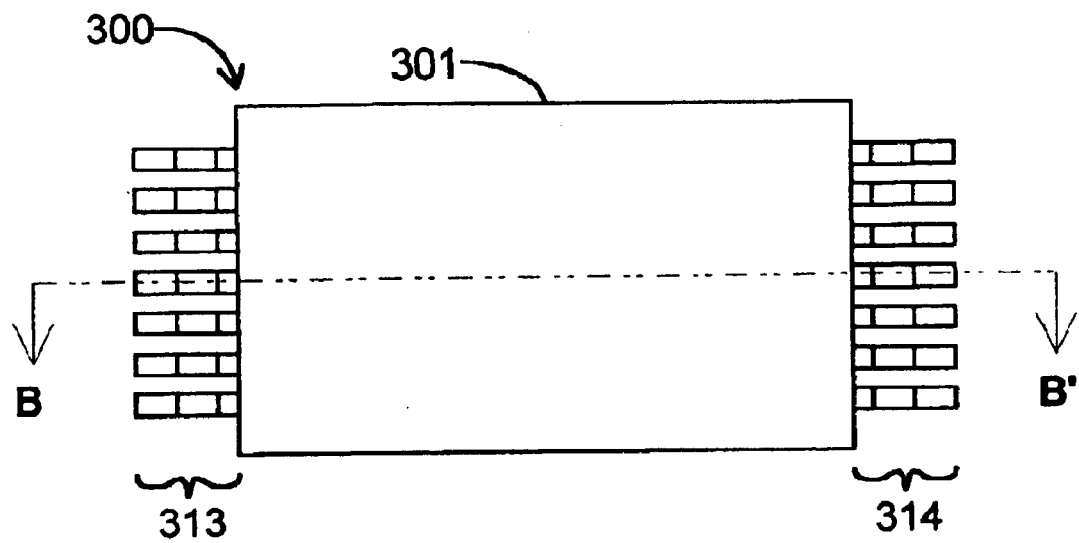
FIGS. 3A, 3B, and 3C show a package arrangements suitable for the invention.
Figure 3B:
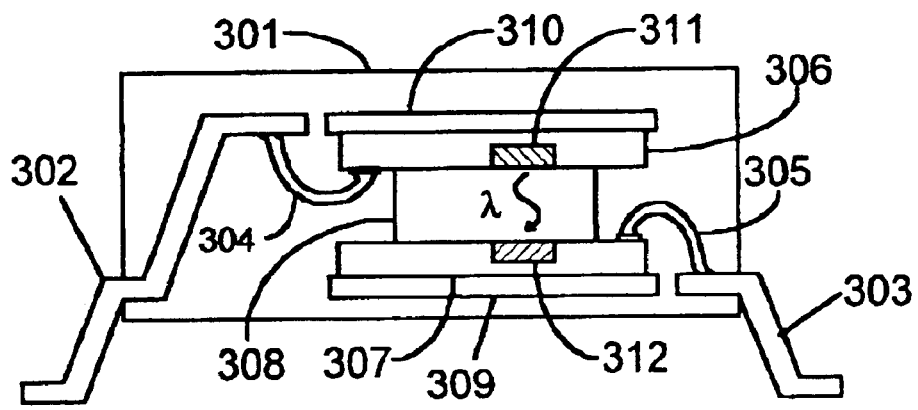

FIG. 3A shows a top view of the package of the preferred embodiment and FIG. 3B shows the corresponding cross section view. The Voltage/Current Threshold circuit 204 and LED 201 comprise the top integrated circuit 306 and the Switch Control 202, the detector amplifier 203, and the light detector 205 comprise the bottom integrated circuit 307. The package pins 314 connected to the primary 120 side integrated circuit 307 are on the right side of the package 300 while the package pins 313 connected to the secondary 122 side integrated circuit 306 are on the left side. Thus, package pins associated with the primary and secondary circuits are physically separated from each other by the width of the package 300. An encapsulant 301 is typically formed using injected plastic.

The cross section FIG. 3B shows an example of secondary side pin 302 of package 300 connecting to the integrated circuit 306 via a bond wire 304. Correspondingly, FIG. 3B shows an example of a primary side pin 303 connecting to integrated circuit 307 via bond wire 303. FIG. 3B also shows the secondary side integrated circuit 306 being attached to lead frame die plate 310 and the primary side integrated circuit 307 being attached to lead frame die plate 309. The two integrated circuits, 306 and 307, are separated by a transparent insulator 308. The silicon based LED 311 of integrated circuit 306 emits light through the transparent insulator 308 to the light detector 312 of integrated circuit 307. It should be noted that the integrated circuit 306 holding the LED 311 could have been located on bottom plate 309 and, correspondingly, the integrated circuit 307 holding the light detector 312 could have been located on the upper plate 310.

Figure 3C:
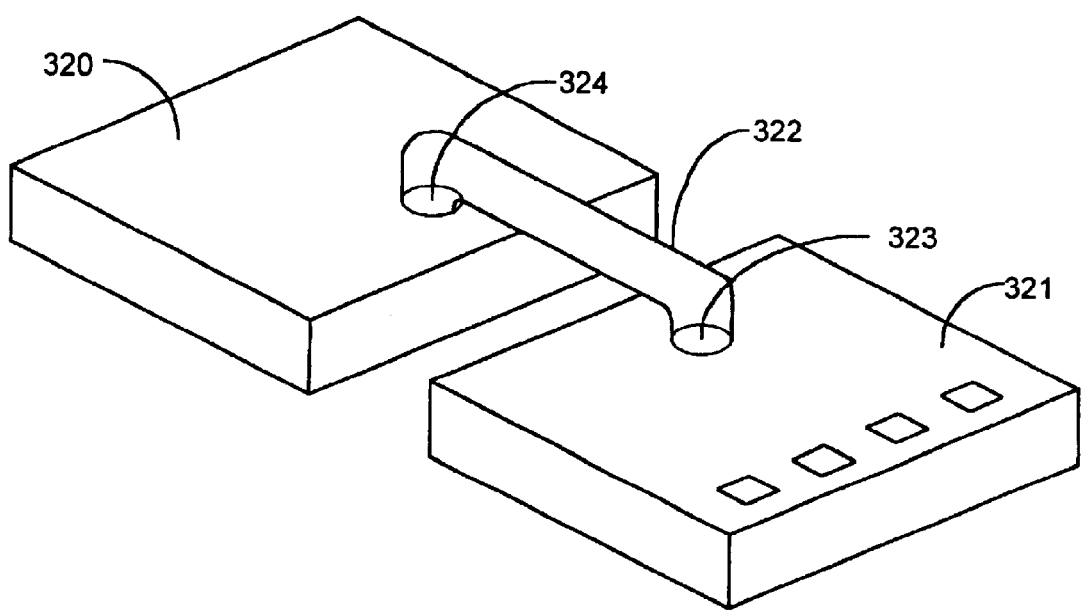

As can appreciated by one normally skilled in the art, there exists other opto coupler packaging methods such as placing the two integrated circuits 320 and 321 side by side with a space between them and optically linking them with a optical fiber or transparent light pipe 322 as shown in FIG. 3C. The silicon LED 323 inputs light to the optical fiber 322 which outputs the light to light detector 324. Both integrated circuits 320 and 321 are placed in a package and wire bonded then encapsulated.

Figure 4:
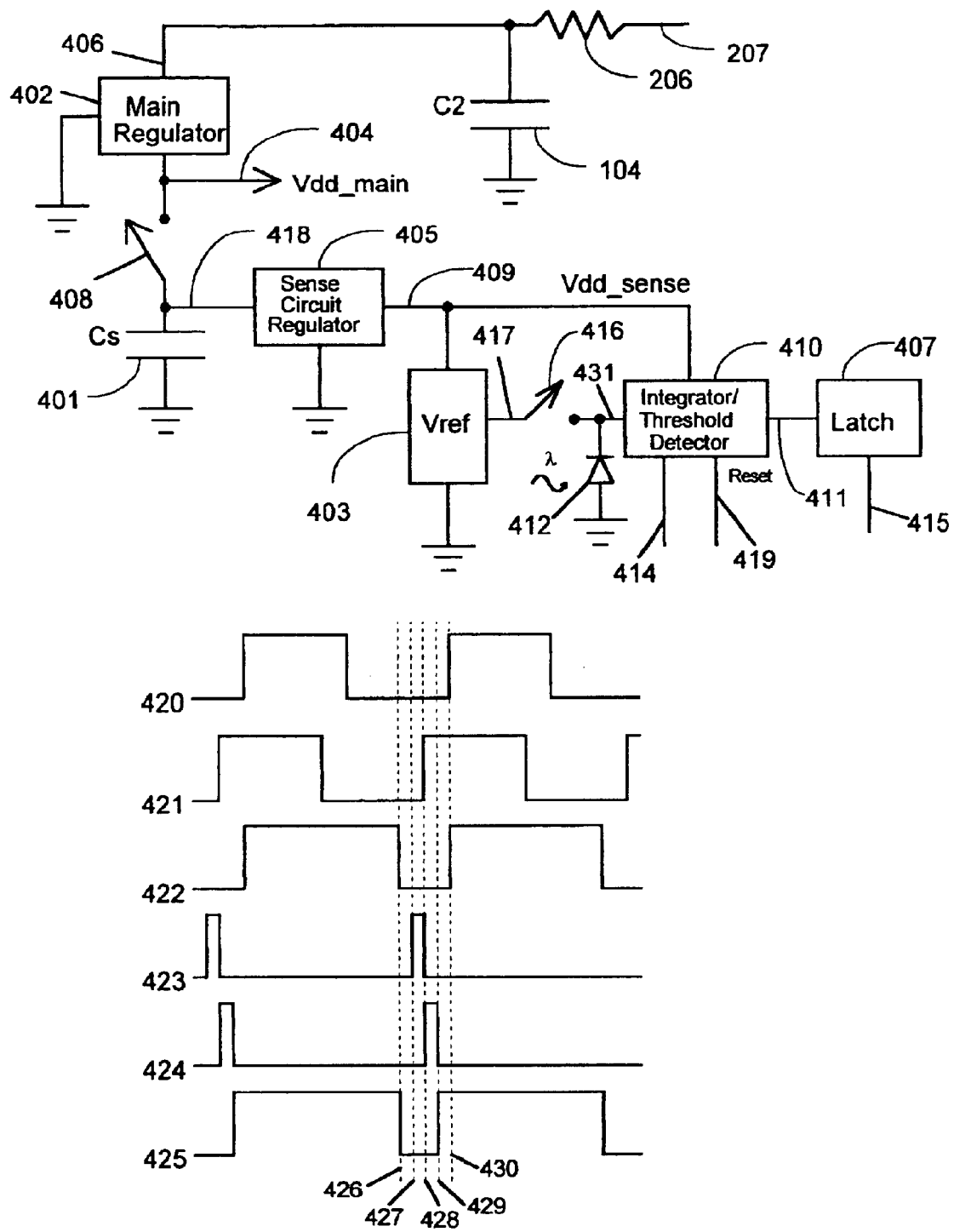
FIG. 4 shows a diagram outlining how to eliminate noise in the sense circuits coming from the power supply and from digital logic transitions.

FIG. 4 shows a diagram outlining a means that can be used to reduce the system noise injection into the sensing operation of the light detector's signal. This diagram shows key elements of the Switch Control 202 chip of FIG. 2 related to noise reduction of the light detector 205 sensing operation. As pointed out earlier, a silicon based LED such as an avalanching silicon PN junction produces a low level light signal. Thus, the light detector signal can be weak and, therefore, steps need to be taken to keep any system noise from interfering with the detection of the signal from the light detector. Two sources of noise are addressed here with one being noise coming from the power supply and the other from digital sequencing operations that are controlled by the system clock.

The most sensitive sensing method involves integrating the light signal over an interval of time. Before the integration interval is started a reset voltage is applied to the light detector. This voltage should be highly stable and free of system noise. At the end of the interval the integrated signal is evaluated to determine if light was present during the interval or light was not present during the interval. A binary bit is then output after the integration of the signal and corresponds to the whether or not a light signal was present during the integration. System noise is typically AC and therefore will integrate to 0. Thus, system noise can be present during the integration phase without degrading the integrated signal output providing that the noise integrates to zero during the interval. What is critical however, that there be no noise present during the process to decide whether or not the integrated signal corresponds to a logical 1 or 0 at the end of the integration interval. A threshold circuit is used determine the corresponding logic state of the integrated light signal. Thus, the power supply for the light signal sensing circuits must be highly stable and noise free during the logical state decision phase and the reference voltage must be highly stable during the detector voltage reset phase.

Clock noise in a digital system can be propagated via the power bus and the substrate. Thus, isolating the digital power bus from the power bus used for the light signal sensing circuit is required. Noise coupled into the substrate can be minimized by performing the logic level decision making process on the integrated output signal of the light detector toward the end of the system clock interval For a positive edge triggered digital system, logic state transitions of the logic circuits start on the positive edge of the clock. By the next positive edge of the clock, all logic circuits must have resolved the logic operations for that clock interval. Thus, logic circuit transitions go to 0 just before the next positive edge of the system clock. Thus, a good time to perform noise sensitive operations is just before the positive clock edge for this example. In fact, if the clock period is long enough, there will be no logic activity for a period of time before the next positive clock transition. It should be noted by one normally skilled in the art that the clock edge for triggering logic operations can also be on the negative edge.

In FIG. 4 resistor 206 is the same as that shown in FIG. 2 and is connected to primary 207. A shunt regulator 406 is used to generate the internal power supply voltage for the Switch Control 202 with capacitor C2 104 providing filtering of the pulsating input power. The output 404 from the regulator 402 is used to supply the system circuits of the Switch Control 202. A second, separate power supply regulator 405 is also provided for the sensing circuit associated with the light signal. A switch 408 is used to disconnect the second regulator 405 from the main power supply output terminal 404. During the disconnect time, capacitor 401 is used to maintain the voltage on node 418 which supplies power to regulator 405. Node 409 is the power supply bus for the sensitive circuits including the reset voltage reference 403 of the light detector and the integrator/threshold detector 410. Regulator 405 is optional but can provide a more stable voltage on node 409 as the voltage on Cs 401 drops somewhat during the disconnect time. The reference voltage on node 417 is connected to the light detector 412 using switch 416. The integrator/threshold detector 410 integrates the output from detector 412 over a period of time and then, after the period, determines if a threshold has been crossed. Node 414 signals the integrator/threshold detector 410 when it's time to resolve the detector's integrated signal as a logical 1 or a logical 0. Node 419 is used to command the integrator/threshold 410 detector to reset in preparation for another integration cycle. The output 411 of the integrator/threshold detector 410 is a binary logic signal and is input to a latch 407. Latch 407 holds the logical state of the output from integrator/threshold detector 410 for processing. Node 415 controls the latching operation of 407.

The sequence of events for sensing the photo signal with the least amount of system noise is controlled by the timing waveforms shown at the bottom of FIG. 4. Signal 420 is the system clock of the Switch Control 202 of FIG. 2. In this example it will be assumed that new logic activity begins on the positive edge of the clock signal although a negative edge could have also been used. Signal 421 is skewed from the system clock signal 420 such that its positive edge at time 428 leads the system clock signal's positive edge at time 430 by some amount of time. Signal 422 is used to disconnect the second regulator's power input 418 from the main regulator 402 and, therefore, controls switch 408. When signal 422 is high switch 408 connects node 418 to the main power supply node 404. When signal 422 is low switch 408 disconnects node 418 from node 404 which allows power for reference source 403 and integrator/threshold detector 410 to come only from capacitor 401. Capacitor 401 must be large enough in capacity to maintain regulator 405's input voltage within operating limits such that the output voltage 409 is constant during the interval from time 426 to time 430.

Signal 425 controls the integration operation of 410 and is connected to the integration control terminal 414 of 410. When signal 425 is high 410 is integrating the signal from the photo detector 412 and when signal 425 is low integration is stopped. Thus, at time 426 the integration of the photo signal from detector 412 is stopped and the integration result held for evaluation. Ideally, at time 426, with the exception of logic circuitry supporting the sensing operation, the system logic circuitry has stopped making transitions in response to a positive system clock 420 edge. Also at time 428 signal 422 goes low thereby disconnecting the sensing circuit's power regulator 405 from the main power bus 404. Node 418 will remain disconnected from the main power supply node 404 until sensing is complete and the output is stored.

At time 427 signal 423 goes high which commands 410 to compare the signal integrated from the output of detector 412 to an internal reference in order to determine the logical state of the output 411. At time 428 the signal 421 undergoes a positive transition. Signal 421 is connected to the clock node 415 of the bit latch 407 which stores data on its input, node 411, when there is a positive clock transition. Thus, at time 428 data on node 411 is stored in 407. Also, at time 428 a reset operation is commanded by signal 424 going high. Signal 424 is connected to 419 of 410 which is the reset control node. The reset switch 416 is also controlled by signal 424 which is closed when signal 424 is high and open when signal 424 is low. Thus, signal 424 resets the integrator of 410 and resets the voltage on the photo detector node 431. The reset of the photo detector node is accomplished by switch 416 closing on command of signal 424 at time 428 and transferring the reference voltage on node 417 to node 431. At time 429 the reset condition is terminated and the integration cycle begins by signal 425 going high. At time 430 the system clock undergoes a positive transition starting another cycle of logic circuit activity. It should be noted that for longer integration times, any number of system clock cycles can be skipped before the integration period is stopped and the result of the integration stored.

Figure 5:
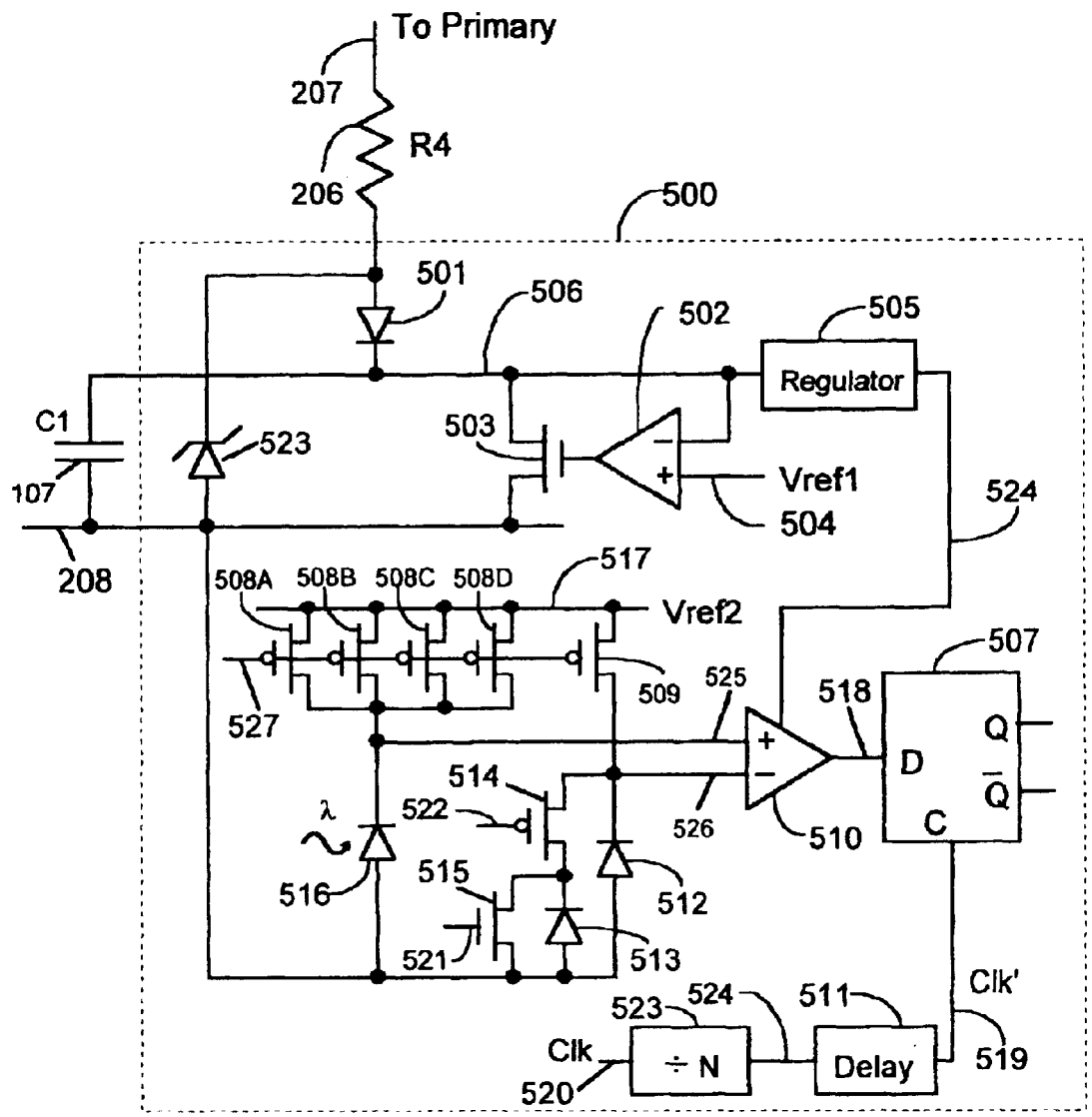
FIG. 5 shows a schematic diagram of part of the circuitry required to implement the Switch Control circuit of FIG. 2 including system noise reduction.

FIG. 5 shows a diagram detailing an implementation of the concept outlined in FIG. 4. FIG. 5 therefore is a detailed schematic of an integrated circuit 500 corresponding to part of the Switch Control 202, amplifier 203, and detector 205 of FIG. 2 that can detect the low light level produced by a silicon based LED. The circuit 500 also corresponds to the primary side circuit 307 of FIG. 3B and is powered by connecting top lead 207 of resistor 206 of FIG. 5 to the low side 207 of the primary 120 of FIG. 2. Thus, during the time M1 105 is off power is applied to the integrated circuit 500 via resistor 206 of FIG. 5. Also note that power for circuit 500 can also be obtained by connecting resistor 206 to the high side 124 of the primary 120 of FIG. 2 or by a separate, dedicated winding on transformer T1 100.

Figure 6:
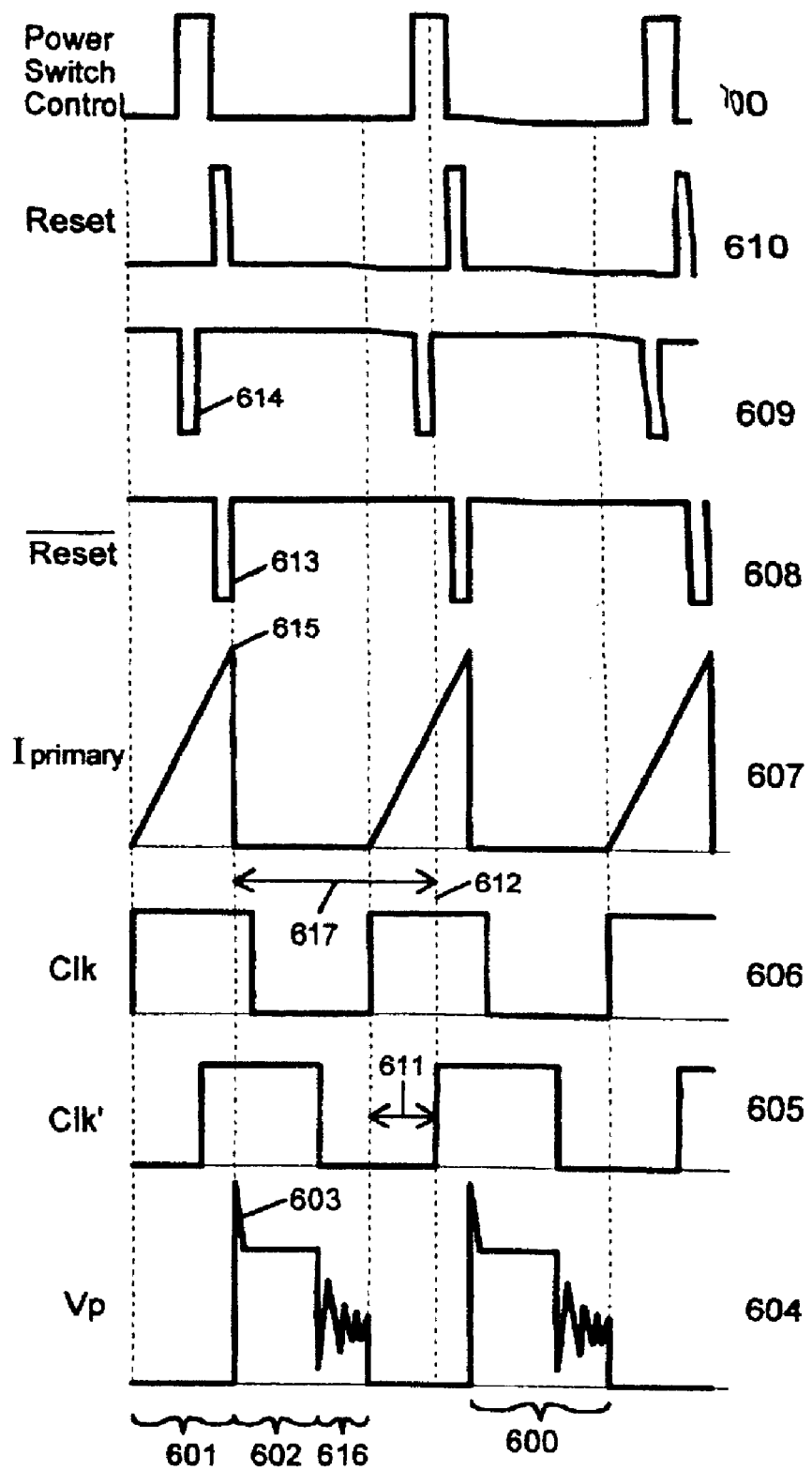
FIG. 6 shows a timing diagram related to the circuit of FIG. 5.

FIG. 6 shows the timing diagram of the various signals present in the power supply circuit depicted in FIG. 5. The Clk signal 606 is used to time events and is generated by an internal oscillator not shown. During the time 601 that M1 105 is "on" the voltage 604 or Vp on the low side 207 of the primary 120 of FIG. 2 is near the ground 208 potential. The voltage drop across M1 105 and R2 106 should be a couple of volts or less. Thus, almost the full voltage present on Vin 112 of FIG. 2 should appear across the primary 120 when M1 105 is "on". Looking at FIG. 6, the current 607 in the primary rises linearly with time based on the equation Vin=Lp di/dt assuming the drop across M1 105 and R2 106 is negligible. Lp is the primary inductance and di/dt is the rate change of the primary 120 current with time. When M1 105 is turned "off" a commutation current flows in the secondary 122 over the interval 602. After the secondary current flow over interval 602 a period 616 of ringing occurs that is associated with the primary 120 inductance and the primary circuit capacitance. Note that a voltage spike 603 occurs due to the primary leakage inductance. During the time secondary current flow interval 602 the voltage Vp 604 is sufficient to power the circuit 500 of FIG. 5. The power supply voltage 506 needed to operate the circuit 500 can be in the range of 3.3 to 20V depending on the CMOS technology used.

In FIG. 5 an isolation diode 501 allows current to flow into the power supply filter capacitor C1 107 when M1 105 is "off". When M1 is "on" the circuit 500 power supply voltage at node 506 is designed to be higher than the low side primary voltage 207. Thus, diode 501 isolates the external voltages such as that from the primary 120 from the internal power supply node 506 during the interval 601 of FIG. 6. During interval 601 power is supplied by the capacitor 107. The interval 601 will therefore be referred to as the quite phase since no external noise voltage will propagate onto node 506 other than a negligible amount via the capacitance of diode 501. It should be noted that in CMOS processes there is no isolated junction diode and, therefore, diode 501 has to be realized using the so called diode connected MOSFET in which the gate is tied to the drain wherein the drain is the anode and the source is the cathode for an NFET. In a BiCMOS process an isolated junction diode can be used.

MOS transistor 503 is a shunt regulator load. It is used to keep the internal power supply voltage 506 of integrated circuit 500 to a level set by an internal reference Vref1 504. Diode 523 is a zener diode and is used to limit the voltage on the power supply node 506 during the start up phase in which power is first applied to the integrated circuit 500. The voltage limit will thus protect the internal circuit of 500 from over voltage damage which could result if the shunt transistor 503 is not activated or cannot respond to a fast transient. The differential amplifier 502 and the shunt regulator transistor 503 are configured as a unity gain amplifier which outputs the voltage Vref1 504 to the power supply node 506. Vref1 504 can be a derived either from a bandgap reference circuit, a zener diode, etc. as can be appreciated by one normally skilled the art. As note earlier, capacitor C1 107 is used as a filter capacitor for the power supply node 506 and can sustain the voltage on node 506 during the off phase 601 when the diode 501 disconnects the power from the primary 120. One side of capacitor 107 is hooked to the power supply node 506 and the second side to the ground 208.

Regulator 505 is an optional series regulator and is used to further filter out power any power supply noise appearing on node 506. The output 524 of regulator 506 is used specifically to power a differential amplifier 510 which is used as a voltage comparitor. The need for secondary regulator depends on the noise present on node 505 during the "off" period 601 and the power supply rejection of amplifier 510.

The positive input of the differential amplifier 510 is connected to the cathode of light detector diode 516 and the negative input to the cathode of a reference diode 512 which has a light blocking cover such as a metal layer. PMOS transistors 508A, 508B, 508C, and 508D are each of equal size and are used to apply a voltage Vref2 517 to the cathode node 525 of the light detector 516. The anode of the light detector diode 515 is connected to ground 208. PMOS transistor 509 is equal in size to transistor 508A and, hence, also to transistors 508B, 508C, and 508D.

Typically, the PN junction area of the light detector diode 516 is on the order of 10,000 square microns for opto couplers. To save area, the reference diode 512 can be made smaller. In the case shown in FIG. 5, the reference diode 512 is made one quarter the size of the light detector diode 516. If the area of the PN junction of the light detector diode 516 is 10,000 square microns then the area of PN junction of the reference diode 512 is 2,500 square microns. Thus, 4 reset transistors, 508A, 508B, 508C, and 508D, are used for the light detector diode 516 versus the one reset transistor 509 for the reference diode 512. This sizing is done so that not only is the reset time for both the light detector diode 516 and reference diode 512 essentially the same, but also the change in voltage on the nodes 525 and 526 due to charge transfer from the reset transistors 508A, 508B, 508C, 508D, and 509 as they turn off. The capacitance ratio between light detector diode 516 and the reference diode 512 can be made more precise if diode 516 is made up of multiples of the layout of diode 512. Thus, in this example, diode 516 can be made of four layout units of diode 512. Putting 4 layouts of 512 in a patch work configuration to make diode 516 would entail some small loss in optical to electrical quantum efficiency.

However, both the capacitance and leakage matching between diode 516 and diode 512 would be much better since the edge effects as well as the area effects would match in the desired ratio which, in this example, is 4. As can be appreciated by one normally skill in the art, other ratios between diode 516 and diode 512 can be used.

The signal sense operation begins with a reset bar or negative going pulse 613 being applied to the gates, node 527, of transistors 508A, 508B, 508C, 508D, and 509. This action charges the positive differential node 525 associated with the cathode of the light detector diode 516 to the Vref2 517 potential. Also, the negative differential node 526 associated with the reference diode 512 is charged to Vref2 517 during this period. The application of Vref2 517 to the positive and negative differential nodes 525 and 526 occurs during the end of the quite phase 601 of the clock cycle which comprises the intervals 600 and 601. After the negative going reset bar pulse 613 is applied to node 527 an integration phase takes place in which the leakage or dark current and the photo current of the light detector 516 discharges node 525 from Vref2. For the reference node 526, only the leakage current discharges this node from Vref2. The integration cycle lasts through the noisy period 600 with sensing occurring in the next quite period. Note that during the noisy period 600 the noise voltage is AC and cancels out soon after the start of the quite phase. Note also that if leakage current tracks with PN junction area then the leakage based differential signal between nodes 525 and 526 at the end of the integration period is small if the input capacitance of the amplifier 510 is much smaller than the diode junction capacitance of the reference diode 512. The input capacitance of the differential amplifier 510 is typically around 0.1 pF which meets the aforementioned criteria for reference diode capacitances of a few pF.

The integration timing cycle is derived from the main clock signal 520. A divide-by-N counter 523 can be used to increase the integration time by lowering the clock frequency. For example, if the clock frequency is 100 KHz then dividing the clock frequency by two (i.e. N=2) would result in an integration time of 20 $\mu$s or twice the period of the clock 520. The output 524 of the divide-by-N counter 523 is assumed to be in phase to the input clock signal 520. The signal output 524 from the divide-by-N counter 523 is then delayed within the quite period 601 of FIG. 6 by a signal delay unit 511. The timing diagram of FIG. 6 assumes that N of the divide-by-N counter 523 set to one. The "D" flip-flop is used to sample the output 518 of the differential comparator 518 on the positive going edge of the delayed clock 519. Thus, "D" flip-flop 507 samples and holds the logic state produced by the comparator 510. The sampling is done, in this example, near the end of the quite period and, thus, the delay time 611 is nearly equal to the quite time 601. Note that the positive edge of the sampling clock, Clk' 605, of the D flip-flop 507 occurs somewhat before M1 105 of FIG. 2 is turned on. It is assumed here that D flip-flop 507 is positive edge triggered. As can be appreciated by one normally skill in the art, the D flip-flop can also be negative edge triggered in which case the Clk' 605 would be inverted. The outputs, Q 527 and Q bar 528 of the D flip-flop 507 go to other circuits which ultimately control the gate voltage on M1 105.

Just prior to sensing the differential signal between nodes 525 and 526, NMOS switch 514 turns on via gate node 522 and slightly discharges the capacitance of reference diode 512. Gate node 522 corresponds to signal 609 in the timing diagram of FIG. 6. This is done to create a half level so that if there is no light applied to diode 516 the differential comparator 510 will output a logic low level. The capacitance used to remove some charge from diode 512 optimally comes from a diode 513 which has the same construction as diode 512 only a smaller area. This is done so that good capacitance tracking between diode 512 and 513 occurs over process variation. The capacitance associated with diode 513 could have also been realized using other means such as, but not limited to, a MOS capacitor and a field capacitor. These capacitors, however, will not have values that will track with any variations of the capacitance of diode 512 due to processing. It should be also noted that diode 513 must be reset between sample periods to ground in order to remove charge gained from being connected to the charged capacitance of diode 512. This reset operation is performed by an NMOS switch 515 connected to ground. The gate 521 of NMOS 515 has applied to it the voltage represented by the signal 610 of the timing diagram of FIG. 6. Thus, during the positive going pulse of 610 NMOS 515 is turned on and the voltage of diode 513 is set to ground potential. This occurs after the differential signal of 525 and 526 has been sampled during the positive edge transition of 519.

Figure 7:
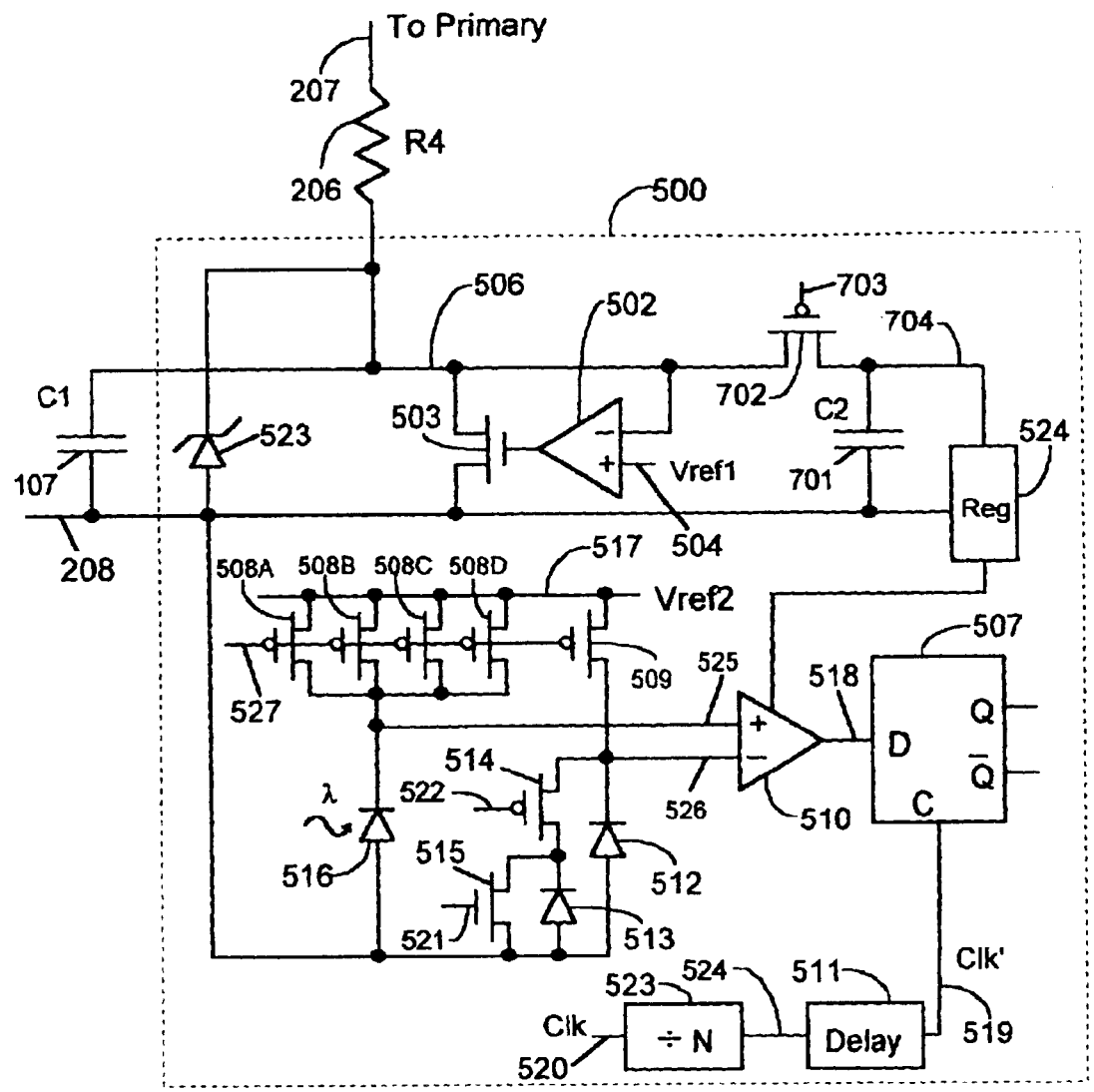
FIG. 7 is a schematic diagram of a variant of the circuit of FIG. 5 in which the power to the light detector sensing circuit is isolated from the main power during sensing using a switch MOSFET.

FIG. 7 shows alternative way to isolate the 516 the differential comparator 510 from the possible noise on the main power node 506. In this implementation a switch PFET 702 disconnects the node secondary power node 704 from the main power node 506 just prior to sensing. That is, just prior to the positive edge of the D flip-flop's clock 605 the PFET 702 will disconnect sub power node 704 from the main power node 506. The sense operation is accomplished when D flip-flop 507 of FIG. 7 locks in the data on the positive edge of Clk' 605. The voltage wave form 700 applied to the gate 703 of the switch PFET 702 is shown at the top of FIG. 6. Note that the voltage 707 goes to a high value just prior to the rising edge of Clk' 605 thereby turning off PFET 703. PFET 703 is turned "on" just after Clk' 605 has gone high. During the time PFET 702 is "on" capacitor 701 is charged to the potential of the main power node 506. During the time PFET 702 is "off" the capacitor 701 supplies power to the comparitor 510. The optional regulator 524 can stabilize the slight decrease in voltage of capacitor 701 over the "off" interval of PFET 702. As can be appreciated by one normally skilled in the art, the switch 702 can also be realized using an NFET or a bipolar transistor in a BiCMOS process.

What is claimed is:

1. An opto-coupler package, comprising:
   a first integrated circuit comprising
      a silicon based LED; and
      a threshold detector circuit electrically coupled to the LED;
   a second integrated circuit comprising
      a light detector configured to detect light from the LED; and
      a switch control circuit electrically coupled to the light detector;
   a first pin electrically coupled to the first integrated circuit;
   a second pin electrically coupled to the second integrated circuit;
   a transparent insulator disposed between the first integrated circuit and the second integrated circuit; and
   an encapsulant encasing the first integrated circuit, the second integrated circuit and the transparent insulator.

2. The package of claim 1, wherein the LED is a silicon PN junction LED.

3. The package of claim 2, wherein the light detector is a Schottky barrier diode.

4. The package of claim 1, wherein the threshold detector circuit is configured to turn on the LED when a voltage signal exceeds a voltage threshold value.

5. The package of claim 4, wherein the threshold detector circuit is configured to turn on the LED when a current signal exceeds a current threshold value.

* * * * *